US008875087B1

(12) United States Patent
Li et al.

(10) Patent No.: US 8,875,087 B1
(45) Date of Patent: Oct. 28, 2014

(54) METHOD AND SYSTEM FOR AUTOMATED SCRIPT GENERATION FOR EDA TOOLS

(71) Applicant: Cadence Design Systems, Inc., San Jose, CA (US)

(72) Inventors: Yinghua Li, San Jose, CA (US); Kei-Yong Khoo, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/632,149

(22) Filed: Sep. 30, 2012

(51) Int. Cl.
*G06F 17/50* (2006.01)

(52) U.S. Cl.
USPC ............ 716/139; 716/100; 716/101; 716/132

(58) Field of Classification Search
USPC .................. 716/100, 101, 132, 139
See application file for complete search history.

(56) References Cited

U.S. PATENT DOCUMENTS

| 5,210,700 | A |   | 5/1993  | Tom             |         |
|-----------|---|---|---------|-----------------|---------|
| 5,493,508 | A |   | 2/1996  | Dangelo et al.  |         |
| 5,526,277 | A | * | 6/1996  | Dangelo et al.  | 716/102 |
| 5,544,066 | A |   | 8/1996  | Rostoker et al. |         |
| 5,544,067 | A | * | 8/1996  | Rostoker et al. | 703/14  |
| 5,557,531 | A |   | 9/1996  | Rostoker et al. |         |
| 5,572,437 | A |   | 11/1996 | Rostoker et al. |         |
| 5,740,347 | A |   | 4/1998  | Avidan          |         |
| 5,790,435 | A |   | 8/1998  | Lewis et al.    |         |
| 5,801,958 | A |   | 9/1998  | Dangelo et al.  |         |
| 5,812,416 | A |   | 9/1998  | Gupte et al.    |         |
| 5,854,752 | A |   | 12/1998 | Agarwal         |         |
| 5,867,395 | A |   | 2/1999  | Watkins         |         |
| 5,870,308 | A |   | 2/1999  | Dangelo         |         |
| 5,880,971 | A |   | 3/1999  | Dangelo et al.  |         |
| 5,903,475 | A |   | 5/1999  | Gupte et al.    |         |
| 5,956,256 | A |   | 9/1999  | Rezek et al.    |         |
| 6,289,498 | B1| * | 9/2001  | Dupenloup       | 716/103 |
| 6,292,931 | B1| * | 9/2001  | Dupenloup       | 716/104 |
| 6,836,877 | B1| * | 12/2004 | Dupenloup       | 716/103 |
| 7,418,683 | B1| * | 8/2008  | Sonnard et al.  | 716/122 |
| 8,185,230 | B2| * | 5/2012  | Miller et al.   | 700/121 |

OTHER PUBLICATIONS

"Timing Influenced Layout Design" by Burstein et al; IEEE 22nd Design Automation Conf., 1985, pp. 124-130.
"Synchronous Path Analysis in MOS Circuit Simulator" by V. D. Agrawal, (1982 IEEE).

* cited by examiner

*Primary Examiner* — Sun Lin
(74) *Attorney, Agent, or Firm* — Vista IP Law Group, LLP

(57) ABSTRACT

Disclosed is an improved method, system, and computer program product to perform automated generation and/or modification of control scripts for EDA tools. A script generator/modifier mechanism is used to access an optimization database to identify potential content of the control script. This potential content is then analyzed to identify the appropriate content to insert into the control script, to accomplish the intended goal of the user in operating the EDA tool. The script generator/modifier mechanism may itself be implemented in a script format.

39 Claims, 9 Drawing Sheets

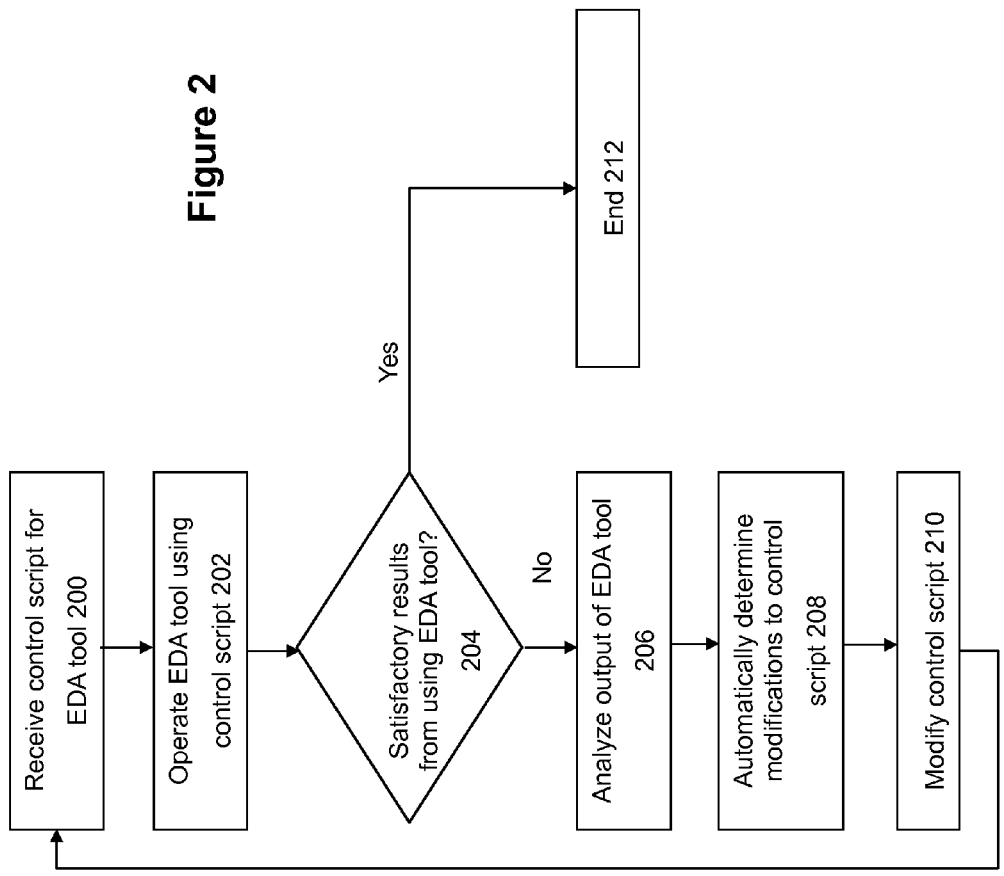

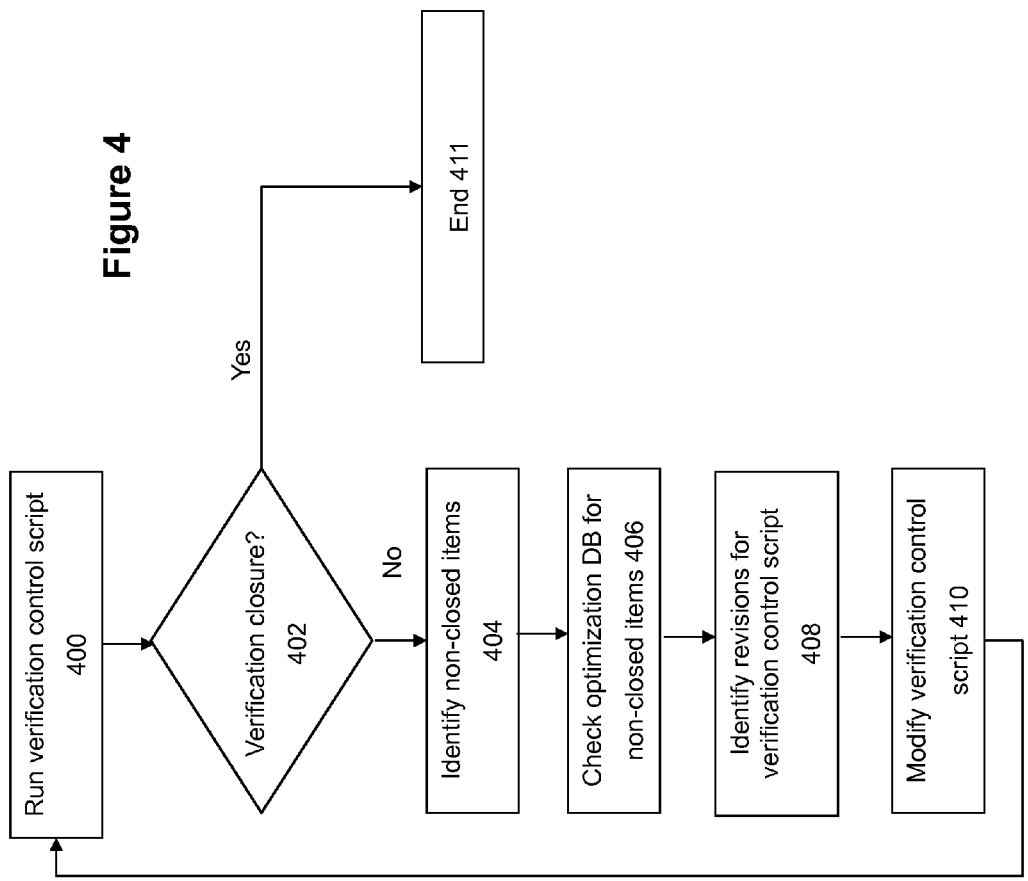

METHOD AND SYSTEM FOR AUTOMATED SCRIPT GENERATION FOR EDA TOOLS

FIELD

The invention relates to the implementation and verification of electronic designs, such as the design of Integrated Circuits (ICs).

BACKGROUND

An integrated circuit has a large number of electronic components, such as transistors, logic gates, diodes, wires, etc., that are fabricated by forming layers of different materials and of different geometric shapes on various regions of a silicon wafer. To design an integrated circuit, a designer first creates high level behavior descriptions of the IC device using a high-level hardware design language. The high level behavior description of the IC device is translated into netlists of various levels of abstraction using a computer synthesis process. A netlist describes interconnections of nodes and components on the chip and includes information of circuit primitives such as transistors and diodes, their sizes and interconnections, for example. The circuit design is then transformed into a geometric description called a layout. The process of converting specifications of an integrated circuit into a layout is called the physical design. The result is a set of design files, which are then converted into pattern generator files.

Given the large numbers of circuit elements in today's integrated circuits, computer-aided design (CAD) and computer-aided engineering (CAE) tools have become essential in assisting circuit designers to produce these complicated ICs. With respect to the design, testing, and implementation of electronic circuit designs, these tools are commonly referred to as electronic design automation (EDA) tools.

For example, one type of EDA tool that is often used in the design process is the synthesis tool, which translates the behavioral representation of the circuit design (e.g., a Register-Transfer-Level (RTL) description) into an implementation representation (e.g., a gate-level representation). The synthesis tool chooses the implementation architecture based on parameters such as timing, footprint, and power consumption. The result of the synthesis process, the gate-level representation, is referred to as the revised circuit, while the behavioral property of the circuit, the RTL representation, is referred to as the golden circuit.

Another type of EDA tool that is commonly used is the verification tool. Verification may be performed at various stages of the electronic design process to verify the performance and functionality of the electronic design. For example, electrical analysis can be performed to verify and check the electrical behavior and performance of the circuit design, e.g., to obtain capacitance and resistance for specific geometric descriptions of conductors in the design. Physical design verification may be performed to check whether variations in the expected manufacture of the product will cause significant differences between the intended dimensions of the circuit features and the as-manufactured dimensions of those features on a fabricated circuit product. Functional verification may be performed to check the correct functionality of the circuit design. Formal verification may be employed to check that the as-designed circuit is equivalent to the original circuit specification.

As EDA tools advance to enable the implementation of designs with ever increasing complexity and size, the methodologies needed to run the tools becomes increasingly more difficult to implement. Taking the verification tool as an example, many tools require the user to write a control program or script (collectively referred to herein as a "control script" or "script") to be executed by the verification tool to verify a design. If the execution of the control script cannot produce a satisfactory result to close the verification process, the user may need to revise the control script with additional features, advanced strategies, customized flows and then re-run the verification. The process of modifying the control script, retrying the verification, and then checking the results, and then retrying continues until the verification is closed.

Conventionally, this process of modifying the control script is performed manually by the user of the EDA tool. The problem is that modern EDA tools have become extremely complicated with a large number of potential options and features that can be employed to run the EDA tool, many of which are not easily known or implemented by the user. Moreover, rapid developments in the technology and equipment used to manufacture semiconductor ICs have allowed electronics manufacturers to create smaller and more densely packed chips that include very high numbers of circuit components and elements to be addressed by the control script. As a result, it has become very burdensome, inefficient, and possibly ineffective to require a user to manually create and/or modify a control script to control the EDA tools.

Therefore, there is a need for an improved approach to implement control scripts for EDA tools.

SUMMARY

Embodiments of the invention provide an improved method, system, and computer program product to perform automated generation and/or modification of control scripts for EDA tools. According to some embodiments, a script generator/modifier mechanism accesses an optimization database to identify potential content of the control script. This potential content is then analyzed to identify the appropriate content to insert into the control script, to accomplish the intended goal of the user in operating the EDA tool. The script generator/modifier mechanism may itself be implemented in a script format.

Other and additional objects, features, and advantages of the invention are described in the detailed description, figures, and claims.

BRIEF DESCRIPTION OF FIGURES

FIG. 2 illustrates a flow of an approach for implementing control scripts according to some embodiments of the invention.

FIG. 4 illustrates a flow of an approach for implementing a control script for a verification tool according to some embodiments of the invention.

DETAILED DESCRIPTION

Embodiments of the invention provide an improved method, system, and computer program product to perform automated generation and/or modification of control scripts for EDA tools. According to some embodiments, a script generator/modifier mechanism accesses an optimization database of potential solutions, and analyzes the current problem in conjunction with the potential solutions to generate content for the control script.

This approach to automated generation/modification of the control scripts allows for problem resolution when running the EDA tool while removing or minimizing the required user intervention. This can significantly reduce the turn-around time for users of EDA tools to finalize an electronic design. In addition, this permits the most optimal solutions to be implemented in the control script, even if the user is not aware of all of the available features and options for the EDA tool.

Figure 1:
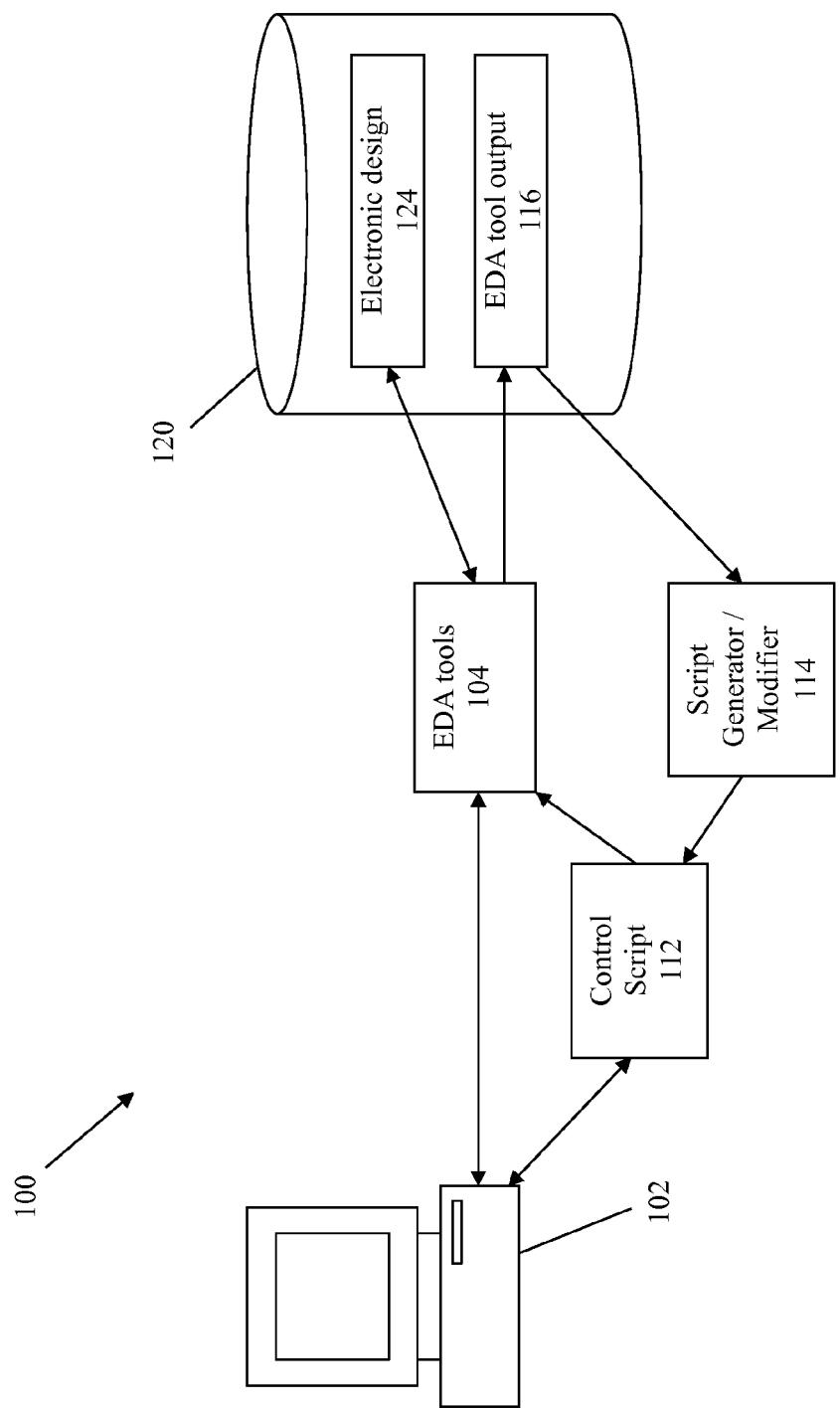
FIG. 1 depicts an architecture of a system for implementing control scripts according to some embodiments of the invention.

FIG. 1 illustrates an example system 100 which may be employed in some embodiments of the invention to perform automated generation and/or modification of control scripts for EDA tools. System 100 includes one or more users at one or more user stations 102 that operate the system 100 to design, edit, and/or verify electronic designs. Such users include, for example, design engineers or verification engineers. User station 102 comprises any type of computing station that may be used to operate, interface with, or implement EDA applications or devices. Examples of such user stations 102 include for example, workstations, personal computers, or remote computing terminals. User station 102 comprises a display device, such as a display monitor, for displaying electronic design layouts and processing results to users at the user station 102. User station 102 also comprises one or more input devices for the user to provide operational control over the activities of system 100, such as a mouse or keyboard to manipulate a pointing object in a graphical user interface.

The electronic designs 124 may be stored in a computer readable storage device 120. Computer readable storage device 120 comprises any combination of hardware and software that allows for ready access to the data that is located at the computer readable storage device 120. For example, computer readable storage device 120 could be implemented as computer memory operatively managed by an operating system. The computer readable storage device 120 could also be implemented as an electronic database system having storage on persistent and/or non-persistent storage.

One or more (CAD) tool or electronic design automation (EDA) design tools 104 can be used by users at a user station 102 to implement the electronic design 124. Any type of design activity may be performed by EDA tool 104. For example, EDA tool 104 may be implemented as a synthesis tool that translates the behavioral representation of the circuit design, (e.g., Register-Transfer-Level (RTL) description) into an implementation representation (e.g., gate-level representation). As another example, the EDA tool 104 may be implemented as a verification tool 114 to verify the electronic design 124. Any type of verification may be implemented by EDA tool 104. The EDA tool 104 may be used to perform formal verification to check that the as-designed circuit is equivalent to the original circuit specification. As another example, the EDA tool 104 may be used to perform electrical analysis can be performed to verify and check the electrical behavior and performance of the circuit design. Another type of EDA tool 104 may be used to perform physical design verification to check the physical characteristics of the layout, e.g., to check whether variations in the expected manufacture of the product will cause significant differences between the intended dimensions of the circuit features and the as-manufactured dimensions of those features on a fabricated circuit product. Functional verification may be performed by the 144 to check for the correct functionality of the circuit design.

The operation of the EDA tool 104 may be run and controlled using one or more control scripts 112. The control script 112 comprises instructions, parameters, and settings to operate the EDA tool. For example, if the EDA tool is performing synthesis functionality, then the control script 112 can be used to control the operation of the EDA tool to perform synthesis by specifying implementation architecture based on parameters such as timing, footprint, and power consumption, library selection, level of efforts, specific features of the tool, and the like. If the control script 112 is being used to control a verification tool, then the control scripts may be configurable to utilize specific features and instructions of the tool, set various verification operating parameters, configure a specific level of processing effort, and implement custom strategies for the verification.

In its design, there can be many variances in the way the control script 112 operates to implement features, strategies, and flows in its operation of EDA tool 104. This is because modern EDA tools are complex enough such that there are a very large number of features, commands, and command instructions usable within the EDA tool. In addition, there are numerous different and alternative approaches and strategies that can be taken to approach any task to be performed by the EDA tool. Given this level of complexity and overwhelming volume of options and features available to the user, it is understandable that the typical user cannot easily and efficiently determine an optimal configuration for the control script 112 for any given EDA tool 104 and a set of problems/tasks to be addressed.

The EDA tool may generate an output 116 that is stored in computer readable medium 120. Many items of status, logging, and/or operation results information may be placed into the output 116 by the EDA tool 104. If the execution of the control script 112 to operate EDA tool 104 does not produce a satisfactory result, then an indication of the unsatisfactory result may be placed into output 116.

To address the unsatisfactory results, a script generator/modifier 114 may be employed to automatically generate and/or modify the control script 112. The script generator/modifier 114 can be used to implement/revise the control script 112 with additional/different features of the EDA tool 104, advanced strategies, customized flows, and/or different parameters. According to some embodiments, the script generator/modifier mechanism has access to a set of data that contains sets of strategies, control sequences, and parameters to address different tasks to be performed by the EDA tool 104. The script generator/modifier 114 analyzes the current problem in the unsatisfactory results, searches the set of data containing the potential solutions, and then modifies the control script 112 to include the new content for the control script. In some embodiments, the script generator/modifier mechanism 114 is itself implemented as a script with a suitable scripting language.

FIG. 2 shows a flowchart of a process for using the script generator/modifier to implement a control script in the context of using an EDA tool. At 200, a control script is received for the EDA tool. The control script comprises any programmable object that can be used to control the operation of an EDA tool. A script in a scripting language may be used to implement the control script, where the control script includes a sequence of operating commands for the EDA tool. The control script may also be implemented using non-scripting languages, e.g., in a compilable programming language that is compiled into a binary executable file.

At 202, the control script is used to operate the EDA tool. For example, the control script may be used to generate an electronic design using a suitable EDA design entry program. Synthesis may be performed by using a control script to operate a synthesis tool. In addition, verification can be performed on an electronic design by using a control script to operate a verification tool.

The operation of the EDA tool will generate a set of output results. For example, a log file may be created by the EDA tool pertaining to the usage of the EDA tool. The log files may be configured to hold data from generating and verifying the electronic circuit design. For example, the functions pertaining to the circuit design that are performed and checked may be recorded into the log file, along with an indication of the results of the verification.

The results from operating the EDA tool are checked at 204. A determination is made whether the operating results are satisfactory. If so, then the process ends at 212. However, if the results are not satisfactory, analysis is performed at 206 to identify the unsatisfactory items in the results. This action may be performed by checking the log file, and searching for keywords pertaining to operational failures or problems.

Processing is then performed at 208 to automatically determine how the problems can be addressed by modification of the control script. A database of possible configurations and implementations for the control scripts is maintained by the system. The database includes different sets of feature combinations and usage, parameters, strategies, and flows for operation of the EDA tool. The problems from the log file are analyzed in conjunction with this database to identify solutions to the problems.

The control script is then modified, at 210, with the identified modifications from the database. The modified control script will therefore include additional and/or different content from original control script. The process thereafter loops back to 200 to execute the modified control script.

This approach provides a very effective way to implement control scripts which address the shortcomings of prior approaches that require extensive manual re-writing of the control scripts. This approach will provide much more optimal implementations to the control scripts, since a database of optimizations is used to provide optimal configurations for the control script. This is particularly useful when there is a very large number of operational features, commands, and options for the EDA tool, such that it is impossible for the user to know about all of those options. However, using the present approach, there is no need for the user to be personally aware of all of those options to make sure his/her usage of the EDA tool takes advantage of those options. In addition, this will provide a much faster electronic design process, since the automated approach can implement the appropriate control scripts much faster and with much less cycles of having to re-write the control script (particularly with much less trial-and-error handling by users). In addition, this is an approach that can be taken to allow developers of the EDA tool to make the tools more user-friendly, by implementing the optimization database to include various options and combination of options that would be useful, without requiring the user to become an expert with the tool.

As an illustrative example of the invention, consider the process to perform verification of a circuit using a verification tool, e.g., to perform formal verification of a circuit design to implement equivalence checking on an integrated circuit (IC) design. As previously noted, modern ICs typically contain large numbers of circuit elements, where designers utilize EDA software to translate the behavioral representation of the circuit (e.g., a Register-Transfer-Level (RTL) description) into an implementation representation (e.g., a gate-level representation). The EDA tool chooses the implementation architecture based on parameters such as timing, footprint, and power consumption. The result of the synthesis process is the gate-level representation, also referred to as the revised circuit, while the behavioral property of the circuit, the RTL representation, is referred to as the golden circuit. The possibility of errors in creating an implementation architecture from a golden circuit is high as the synthesis process can be quite complex. With increasing design complexity, formal verification has become an important step in the design process to ensure that the revised circuit is equivalent to the original specification, or golden circuit. In the verification of digital circuits, signals in the circuits are "compared" in some manner in order to draw a conclusion on the "correctness" of one or more properties of the circuits. For example, to determine if two circuits with identical state encoding will behave identically under some excitations, the simulated values of the corresponding state-points in the two circuits are compared when the circuits are subjected to the same excitations. Alternatively, to show that the two circuits will behave identically under all possible excitations, a formal methodology is used wherein the functions of the corresponding state-points in the two circuits are proved to be functionally equivalent. Therefore, during equivalence checking, implementation architecture is created for the golden circuit and is compared to a possibly synthesized revised implementation circuit to determine if they are equivalent.

A log file may be created during this equivalence checking process that identifies the actions taken during the formal verification process, the circuit portions being verified, and the specific results of the equivalence checking. The log file may include notations to identify determinations of equivalence ("EQ"), non-equivalence ("NEQ"), and situations where the verification action needs to be halted or skipped ("ABORT"). To goal of the verification process is to achieve closure of all items being checked by the verification tool.

Figure 3A:
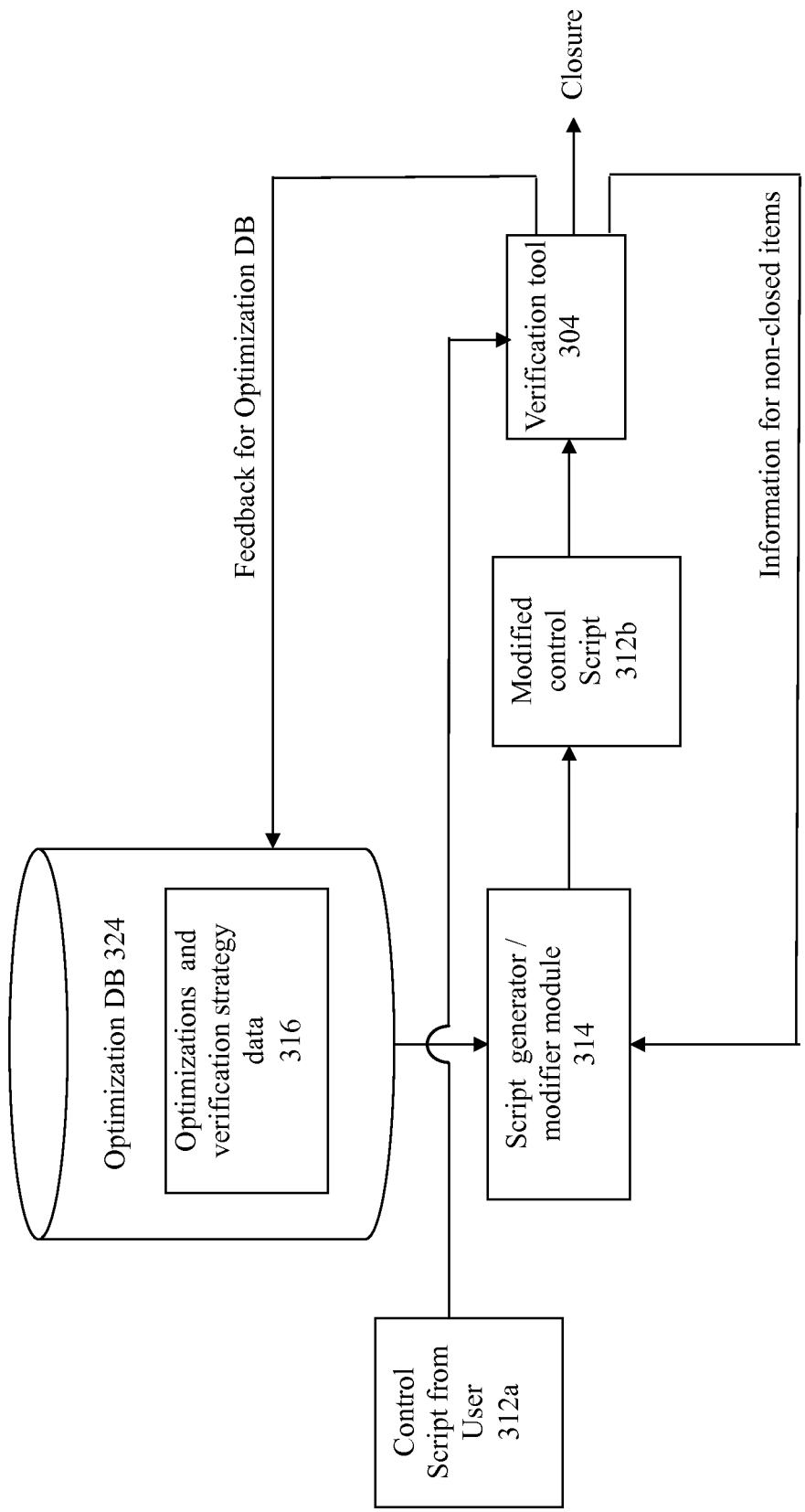
FIGS. 3A-C illustrate approaches for implementing control scripts for a verification tool according to some embodiments of the invention.

FIG. 3A illustrates a system to implement a control script for a verification tool 304 (such as a formal verification tool) according to some embodiments of the invention. In this architecture, a control script 312a is provided by the user to operate the verification tool 304. The control script 312a for the verification tool 304 may be referred to herein as a "dofile". The control script 312a provided by the user includes scripting language constructs that implements functions and features of the verification tool 304 to verify a given electronic circuit design, e.g., to perform equivalence checks for circuit elements in the design.

The control script 312a provided by the user is used to operate the verification tool 304. The operation of the verification tool 304 may result in a set of non-satisfactory results. For example, non-closure may occur for various verification items/tasks to be performed by the verification tool 304. In this situation, information about the non-closed items is passed to the script generator/modifier mechanism 314. The script generator/modifier mechanism 314 accesses a database 324, which comprises an optimization database and/or a design information database. The optimization database 324 includes a set of data 316 pertaining to optimization of control/configuration scripts (collectively referred to herein as "control scripts"). The design information database includes information to track completed and remaining tasks. In some embodiments, the design information database comprises implementation tool outputs and/or verification historical results.

The set of data 316 in database 324 comprises information relating to possible configurations and implementations for the verification tool 304, including for example, different sets of feature combinations and usage, parameters, strategies, and flows for operation of the verification tool 304 with respect to certain types or categories of tasks and problems to be addressed by the control scripts.

In some embodiments, content in the optimization database 324 may be organized as a set of IF-THEN type rules that provide guidance regarding the specific, common, and/or well-known problems that may be encountered during operation of the verification tool 304. The script generator/modifier 314 analyzes the non-closure problems by checking which, if any, of the IF-THEN rules have content that apply to the problems that have been encountered. The applicable IF-THEN rules are applied to identify the content that should be placed into the control script.

One particular example of the invention may include the following variations (may be referred to as command line options in some implementations) that can be chosen for implementation in a control script in response to identified non-closure problems:

1. Variation of flows, e.g., command execution sequence;
2. Variations of comparison methodologies, e.g., restrict partition;
3. Variations of efforts, e.g., variations of limits in the number of steps that an algorithm can execute; and/or 4. Variations of resource allocations, e.g., number of threads, CPU runtime limits.

These are optional processing strategies that can be selected for implementation in a control script. For example, the "Effort_High" may be an option that should be applied for certain circumstances, despite the high level of resources that would be expended to use this option. Nevertheless, closure of certain portions of the design may require this option in certain circumstances, which would be recognized based upon rules established in the optimization database 324 with respect to this option.

The identified changes are applied by the script generator/modifier 314 to generate a modified control script 312b. The modified control script 312b is then used to perform another verification run by operation of the verification tool 304.

FIG. 4 is a flowchart of an approach to implement a control script for a verification tool according to some embodiments of the invention. At 400, a verification control script is run to operate a verification tool for a given electronic design. At 402, the results output from running the verification is reviewed to determine whether verification closure has been achieved. If so, then the process ends at 411.

If verification closure is not achieved, then identification is made at 404 of the non-closed items. In some embodiments, a verification log file is reviewed to identify the closure problems for the verification process. At 406, the optimization database is checked with respect to the identified closure problems.

At 408, identification is made of the content that should be implemented in the control script to address the non-closure problems. This identified content may include, for example, additional features, functions, parameter settings, strategies, flows, and/or combination thereof to include into the control script for operation of the verification tool. At 410, the identified content is used to modify the control script. The process then loops back to 400 to use the modified control script to operate the verification tool.

A learning process can be implemented to improve the quality of the data within the optimization database. Feedback can be provided from the output of the verification tool regarding information about the effectiveness of certain control options. The feedback information can be used to determine suitability of the control options for certain types of verification problems and circumstances.

Figure 5:
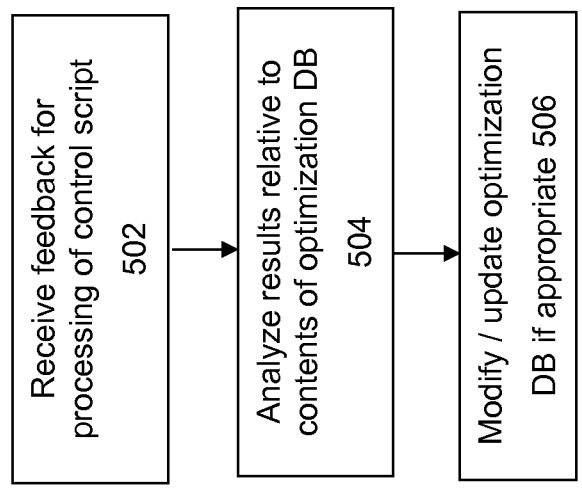
FIG. 5 illustrates a flow of an approach for implementing a learning system to implement control script according to some embodiments of the invention.

FIG. 5 provides a flowchart of an approach for implementing this learning process. At 502, feedback is received from a prior usage of a control script for the verification tool. The feedback comprises information about the operation of the control script, and the results that were achieved using that control script.

At 504, the feedback is analyzed. One type of analysis that can be performed is to check whether a prior modification to the control script performed as expected to resolve a non-closure problem. If not, then this provides useful information that can be taken into consideration for the future to perhaps restrict usage of that modification. Another type of analysis is to identify specific portions of the control script that operated very well, and therefore should be added to optimization database to be used in the future.

At 506, the optimization database is modified to address the issues raised in the feedback. The set of rules IF-THEN rules in the optimization database may be modified as appropriate. For example, certain rules may be eliminated if they are shown to be ineffective. Other rules may be modified to increase their effectiveness. The scope of the rules may be changed, both in terms of content as well as applicability. The modifications may be automatically implemented in the optimization database, or may be manually provided after review by an authorized administrator of the system.

Figure 3B:
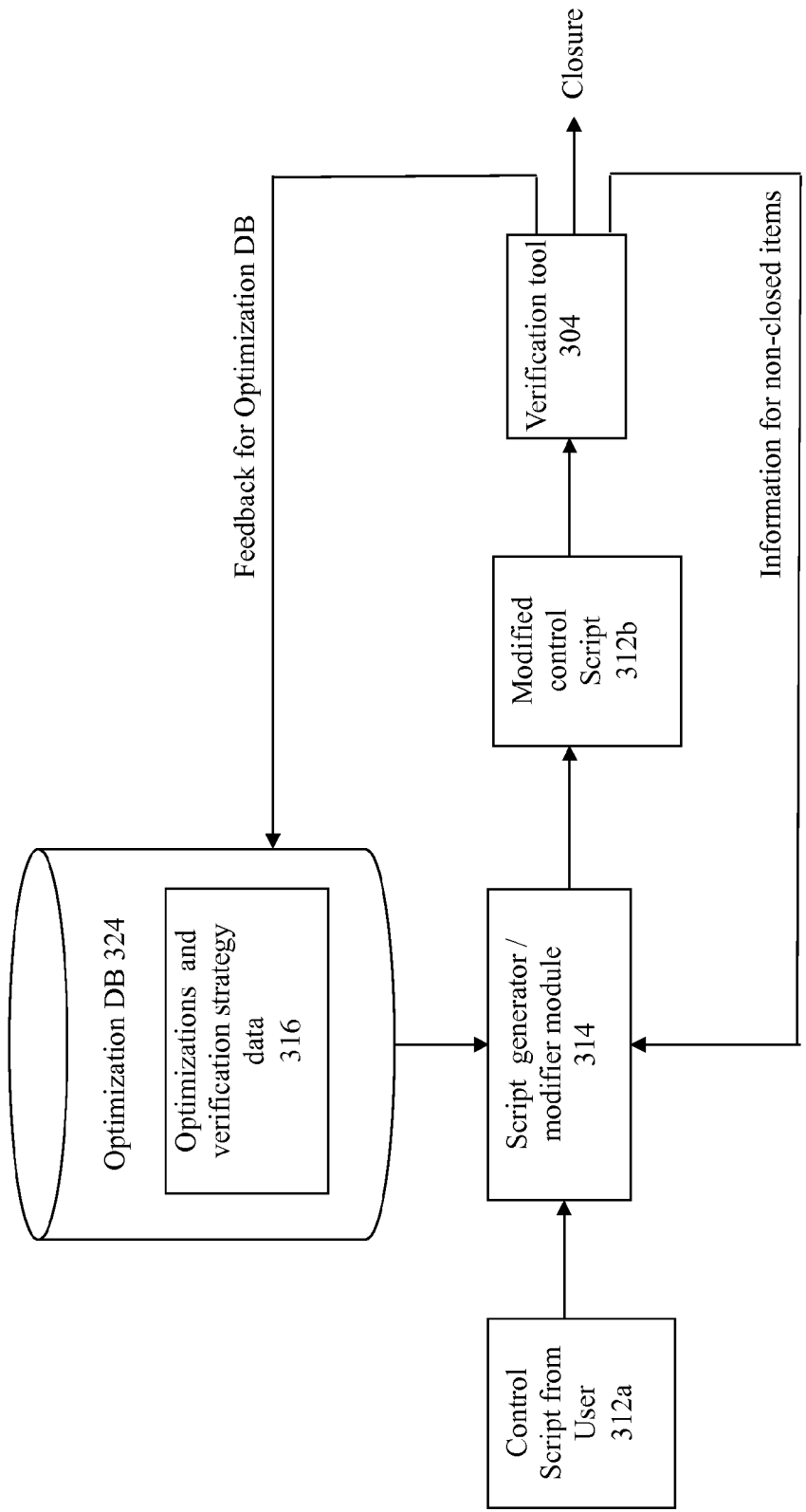

The approach described above with respect to FIG. 3A pertains to a situation in which the original control script 312a is provided by the user, which is executed in an unaltered form to operate the verification tool 304. FIG. 3B illustrates an alternative approach in which the control script 312a undergoes a checking process before it is used to operate the verification tool 304. The script generator/modifier mechanism 314 analyzes the control script 312a for different kinds of issues.

One possible issue that is checked is to determine if there are any incorrect or ineffective portions of the control script 312a. For example, the usage of commands in the control scripts is reviewed to make sure that it is used correctly in the control script. Issues such as syntax and parameter problems can also be identified at this stage. Another issue to check is to determine, even if the script is operationally or syntactically correct, whether there are any optimizations that can be provided to increase the effectiveness or efficiency of the verification process. Based upon this analysis, modifications are made to create a modified control script 312b. The modified control script 312b can then be used to operate the verification tool 304.

Figure 3C:
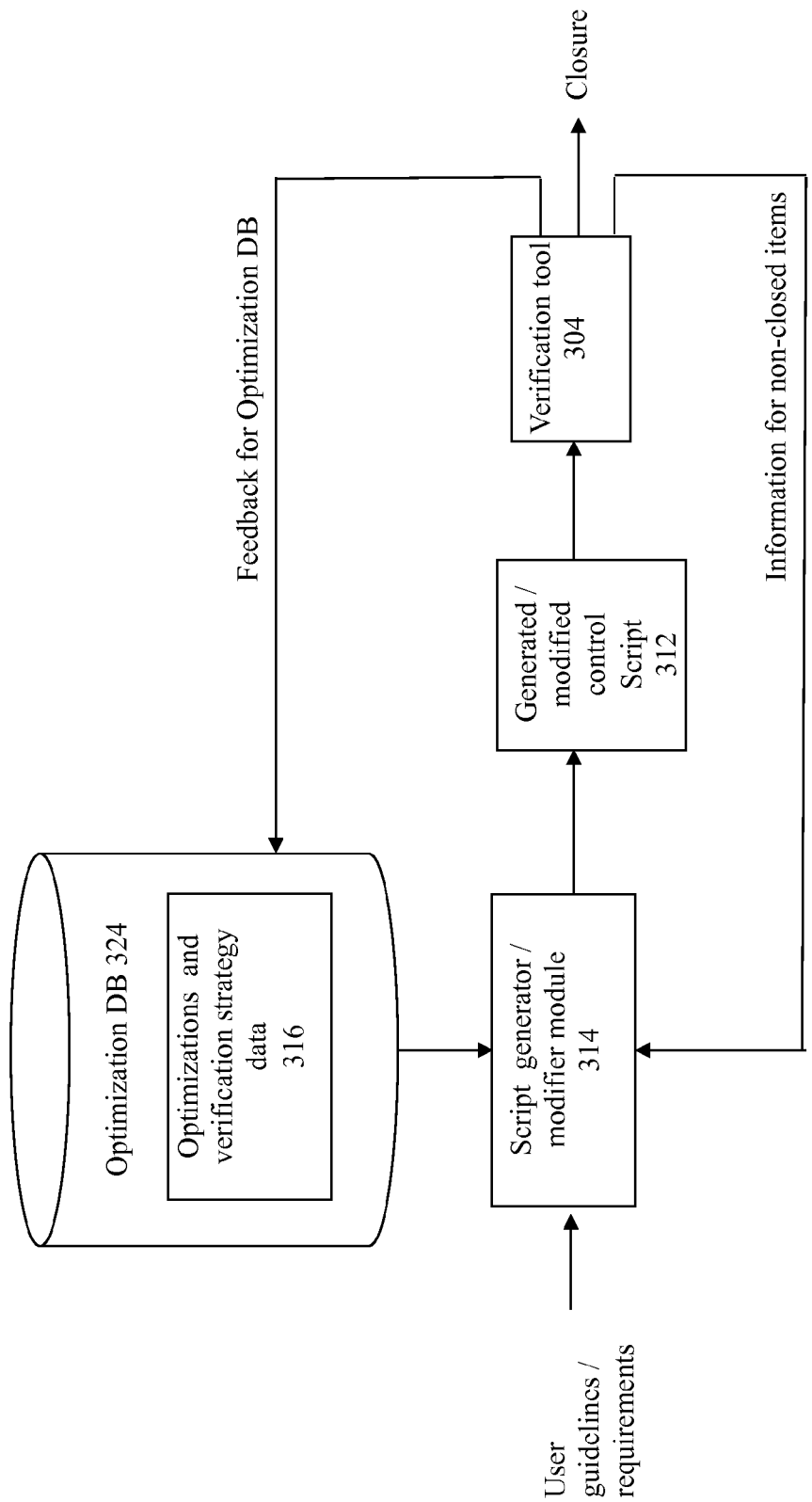

FIG. 3C shows yet another approach that can be taken, where the user does not even need to provide the initial control script. Instead, the system itself will generate the control script 312. The user may provide guidelines for the verification process. For example, the user may identify the type of verification that is desired, e.g., flat or hierarchical verification. The script generator/modifier mechanism 314 will then analyze the design, review the information set forth in the optimization database, determine the contents of the control script, and will then generate the control script 312.

Figure 6:
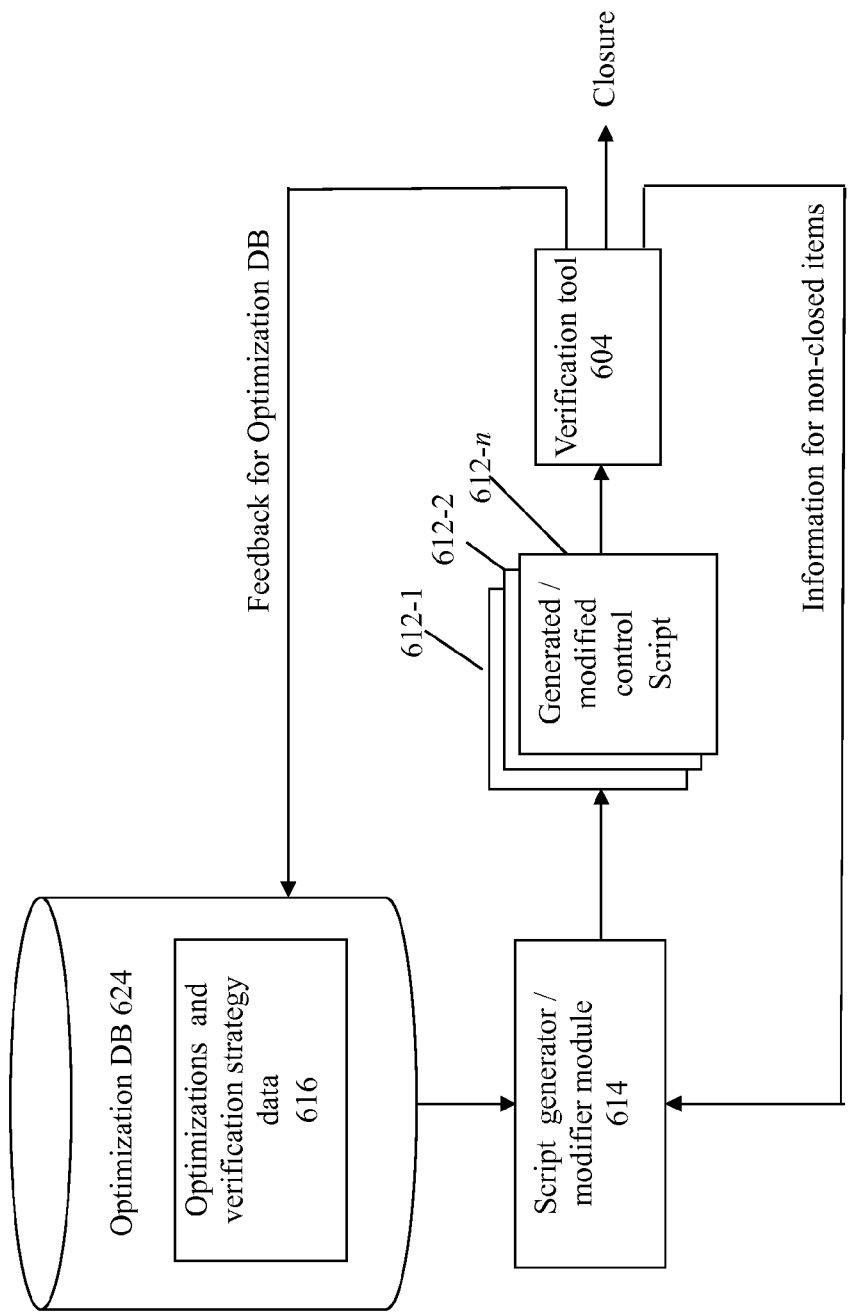
FIG. 6 illustrates an approach for implementing multiple control scripts according to some embodiments of the invention.

In certain circumstances, a helpful strategy that can be selected by the script generator/modifier mechanism is to use multiple control scripts to verify an electronic design. This approach is illustrated in FIG. 6, which shows multiple control scripts 612-1, 612-2, and 612-n. The idea is that multiple strategies may be needed to address the different problems inherent in the different portions of the electronic design. As such, a single control script may not be the most efficient approach to operate the verification tool 604.

In this situation, the script generator/modifier mechanism 614 may choose to generate the multiple control scripts 612-1, 612-2, and 612-n. Each of the control scripts may implement different options for controlling the verification tool 604. Even if a single control script cannot provide closure for the entire design, closure can be achieved by having different control scripts provide closure for different portions of the design, such that combination of all of the control scripts achieves closure for the entire design.

Therefore, what has been described is an improved method, system, and computer program product to perform automated generation and/or modification of control scripts for EDA tools. A script generator/modifier mechanism has been described which can be used to access an optimization database to identify potential content of the control script. The appropriate content is inserted into the control script to accomplish the intended goal of the user in operating the EDA tool.

System Architecture Overview

Figure 7:
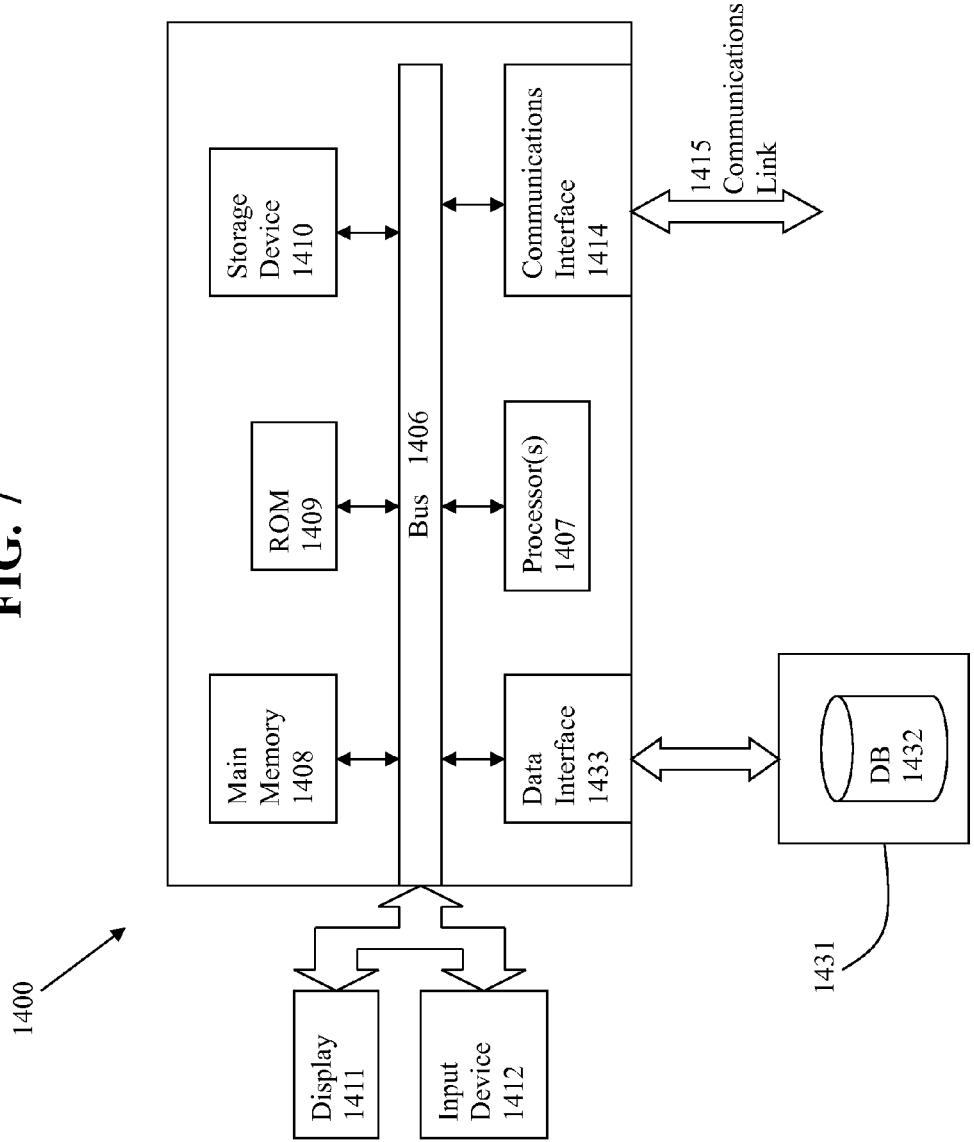
FIG. 7 shows an architecture of an example computing system with which the invention may be implemented.

FIG. 7 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution. The computer system may also use a data interface 1433 to communicate with a database 1432 in a computer readable storage device 1431.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

The invention claimed is:

1. A computer implemented method implemented with a processor, the method comprising:
   analyzing a set of tasks to be performed by an electronic design automation (EDA) tool;
   automatically generating a control script to implement the set of tasks by at least choosing at least one appropriate content item from multiple potential content items for insertion into the control script, wherein
      an optimization database and a design information database are accessed to generate the control script, the optimization database comprising rules for optimizing the control script and the multiple potential content items that constitute candidates for insertion into the control script, and
      the at least one appropriate content item is chosen from the multiple potential content items based at least in part upon results of analyzing the multiple potential content items; and
   using the control script to operate the EDA tool to perform the set of tasks.

2. The method of claim 1, further comprising modifying the control script to include a customized flow without user intervention.

3. The method of claim 1, wherein the control script performs at least one of a configuration functionality or a control functionality.

4. The method of claim 1, wherein the design information database tracks completed and remaining tasks.

5. The method of claim 4, wherein the design information database comprises at least one of implementation tool outputs or verification historical results.

6. The method of claim 1, wherein the optimization database comprises rules for applicability of options for the control script.

7. The method of claim 1, wherein a script is employed to automatically generating the control script.

8. The method of claim 1, wherein an initial control script is provided by a user, and the initial control script is analyzed for the set of tasks to generate the control script.

9. The method of claim 1, wherein the control script is generated without an initial control script being provided by a user.

10. The method of claim 1, wherein the control script is generated in response to a non-satisfactory result from prior operation of the EDA tool.

11. The method of claim 1, wherein a feedback from an operation of the control script is provided to update the optimization database.

12. The method of claim 1, wherein multiple control scripts are generated to control the EDA tool.

13. The method of claim 1, wherein the EDA tool corresponds to a synthesis tool or a verification tool.

14. A computer program product embodied on a non-transitory computer usable medium, the non-transitory computer readable medium having stored thereon a sequence of instructions which, when executed by a processor, causes the processor to execute a method, the method comprising:

analyzing a set of tasks to be performed by an electronic design automation (EDA) tool;

automatically generating a control script to implement the set of tasks by at least choosing at least one appropriate content item from multiple potential content items for insertion into the control script, wherein an optimization database and a design information database are accessed to generate the control script and the multiple potential content items that constitute candidates for insertion into the control script, the optimization database comprising the multiple potential content items that constitute candidates for insertion into the control script and rules for optimizing the control script, and the at least one appropriate content item is chosen from the multiple potential content items based at least in part upon results of analyzing the multiple potential content items; and using the control script to operate the EDA tool to perform the set of tasks.

15. The computer program product of claim 14, wherein the optimization database comprises a set of data pertaining to features, functions, parameters, flows, or strategies for operating the EDA tool.

16. The computer program product of claim 14, wherein the control script performs at least one of a configuration functionality or a control functionality.

17. The computer program product of claim 14, wherein the design information database tracks completed and remaining tasks.

18. The computer program product of claim 17, wherein the design information database comprises at least one of implementation tool outputs or verification historical results.

19. The computer program product of claim 14, wherein the optimization database comprises rules for applicability of options for the control script.

20. The computer program product of claim 14, wherein a script is employed to automatically generating the control script.

21. The computer program product of claim 14, wherein an initial control script is provided by a user, and the initial control script is analyzed for the set of tasks to generate the control script.

22. The computer program product of claim 14, wherein the control script is generated without an initial control script being provided by a user.

23. The computer program product of claim 14, wherein the control script is generated in response to a non-satisfactory result from a prior operation of the EDA tool.

24. The computer program product of claim 14, wherein a feedback from an operation of the control script is provided to update the optimization database.

25. The computer program product of claim 14, wherein multiple control scripts are generated to control the EDA tool.

26. The computer program product of claim 14, wherein the EDA tool corresponds to a synthesis tool or a verification tool.

27. A system for implementing a control script for an electronic design automation tool, comprising:

a processor;

a memory for holding programmable code; and wherein the programmable code includes instructions for analyzing a set of tasks to be performed by an electronic design automation (EDA) tool, automatically generating a control script to implement the set of tasks by at least choosing at least one appropriate content item from multiple potential content items for insertion into the control script, wherein an optimization database and a design information database are accessed to generate the control script, the optimization database comprising the multiple potential content items that constitute candidates for insertion into the control script and rules for optimizing the control script, and the at least one appropriate content item is chosen from the multiple potential content items based at least in part upon results of analyzing the multiple potential content items; and using the control script to operate the EDA tool to perform the set of tasks.

28. The system of claim 27, wherein the optimization database comprises a set of data pertaining to features, functions, parameters, flows, or strategies for operating the EAD tool.

29. The system of claim 27, wherein the control script performs at least one of a configuration functionality or a control functionality.

30. The system of claim 27, wherein the design information database tracks completed and remaining tasks.

31. The system of claim 30, wherein the design information database comprises at least one of implementation tool outputs or verification historical results.

32. The system of claim 27, wherein the optimization database comprises rules for applicability of options for the control script.

33. The system of claim 27, wherein a script is employed to automatically generating the control script.

34. The system of claim 27, wherein an initial control script is provided by a user, and the initial control script is analyzed for the set of tasks to generate the control script.

35. The system of claim 27, wherein the control script is generated without an initial control script being provided by a user.

36. The system of claim 27, wherein the control script is generated in response to a non-satisfactory result from a prior operation of the EDA tool.

37. The system of claim 27, wherein feedback from operation of the control script is provided to update the optimization database.

38. The system of claim 27, wherein multiple control scripts are generated to control the EDA tool.

39. The system of claim 27, wherein the EDA tool corresponds to a synthesis tool or a verification tool.

* * * * *